(12) United States Patent  (10) Patent No.: US 8,073,988 B2
Honda  (45) Date of Patent: Dec. 6, 2011

(54) RECONFIGURABLE COMPUTING DEVICE AND METHOD FOR INSPECTING CONFIGURATION DATA

(75) Inventor: Makoto Honda, Menlo Park, CA (US)

(73) Assignees: Toyota Infotechnology Center., Ltd., Tokyo (JP); Toyota Jidosha Kabushiki Kaisha, Toyota (JP)

( * ) Notice: Subject to any disclaimer, the term of this patent is extended or adjusted under 35 U.S.C. 154(b) by 82 days.

(21) Appl. No.: 12/585,542

(22) Filed: Sep. 17, 2009

(65) Prior Publication Data

US 2010/0036972 A1 Feb. 11, 2010

Related U.S. Application Data

(63) Continuation of application No. PCT/JP2008/055987, filed on Mar. 21, 2008.

(30) Foreign Application Priority Data

Mar. 22, 2007 (JP) ................................. 2007-074355

(51) Int. Cl.
- *G06F 3/00* (2006.01)
- *H03K 19/173* (2006.01)
- *H03K 19/177* (2006.01)

(52) U.S. Cl. ................................ 710/12; 326/38; 326/39
(58) Field of Classification Search ...................... 326/38
See application file for complete search history.

(56) References Cited

U.S. PATENT DOCUMENTS

| | | | | |
|---|---|---|---|---|
| 5,457,408 | A * | 10/1995 | Leung | 326/38 |
| RE37,195 | E * | 5/2001 | Kean | 326/39 |
| 6,255,848 | B1 * | 7/2001 | Schultz et al. | 326/41 |
| 6,351,143 | B1 * | 2/2002 | Guccione et al. | 326/40 |
| 6,668,361 | B2 * | 12/2003 | Bailis et al. | 716/113 |
| 7,411,417 | B1 * | 8/2008 | Rutledge et al. | 326/38 |
| 7,759,968 | B1 * | 7/2010 | Hussein et al. | 326/38 |
| 2003/0099358 | A1 | 5/2003 | Michael et al. | |

FOREIGN PATENT DOCUMENTS

| | | |
|---|---|---|
| JP | A-2002-313097 | 10/2002 |
| JP | A-2003-50258 | 2/2003 |
| JP | A-2003-122442 | 4/2003 |
| JP | A-2003-304235 | 10/2003 |
| JP | A-2006-5708 | 1/2006 |

OTHER PUBLICATIONS

Wadhwa, Sameer et al., "Efficient Self-Reconfigurable Implementations Using On-chip Memory", pp. 443-448, Copyright Springer-Verlag Berlin Heidelberg 2000.*

* cited by examiner

*Primary Examiner* — Tariq Hafiz
*Assistant Examiner* — Dayton Lewis-Taylor
(74) *Attorney, Agent, or Firm* — Oliff & Berridge, PLC

(57) ABSTRACT

A reconfigurable computing device includes a reconfigurable logical device of which a circuit logic can be changed based on configuration data, a storage part to store beforehand input-output attributes of input-output parts of the reconfigurable logical device, and a verification part to verify the configuration data by making a comparison between information on the input-output parts in the configuration data and the input-output attributes stored in the storage part. With this, it is possible to inspect the configuration data of the reconfigurable logical device by a simple method.

4 Claims, 7 Drawing Sheets

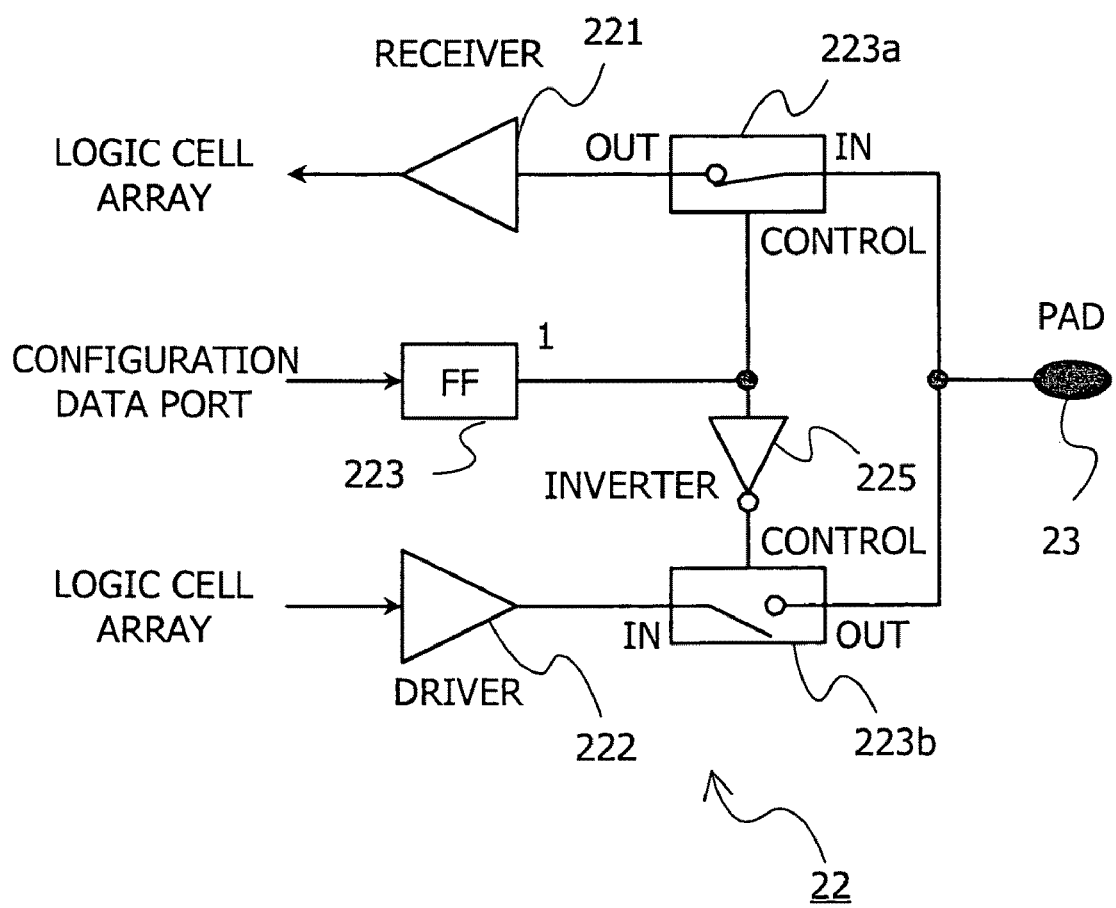

(a) NORMAL CONFIGURATION DATA (b) FALSIFIED CONFIGURATION DATA (c) PAD ATTRIBUTE DATA

RECONFIGURABLE COMPUTING DEVICE AND METHOD FOR INSPECTING CONFIGURATION DATA

CROSS-REFERENCE TO RELATED APPLICATION

This application is a continuation of International Application PCT/JP2008/55987 which was filed on Mar. 21, 2008, and claims priority from Japanese Patent Application 2007-74355 which was filed on Mar. 22, 2007, the contents of which are herein wholly incorporated by reference.

BACKGROUND OF THE INVENTION

1. Field of the Invention

The present invention relates to a reconfigurable logical device, and in particular it relates to a technique of inspecting configuration data of the reconfigurable logical device.

2. Description of the Related Art

In a device (reconfigurable logical device), such as an FPGA (Field Programmable Gate Array) of which a circuit logic can be changed based on configuration data (circuit information data), the configuration data, if not correct, will be a cause that damages the device. For example, when both pads (pins), which are input-output parts of an FPGA chip, and a peripheral circuit, which is connected thereto, are in output states, there will be a high probability that the device will be damaged.

An FPGA can be used for the purpose of changing and/or updating the function of a product by causing its configuration data to be downloaded after the shipment thereof. For example, with an in-vehicle device using an FPGA, the function thereof can be changed by downloading its configuration data via a wireless network or a recorded storage medium from the outside of a vehicle. At the time when such configuration data is downloaded, an alteration or falsification by a third party will pose a problem. It is considered that with an intention to destroy the device, a third party may alter or falsify the configuration data so as to place both the pads of the FPGA and its peripheral circuit into their output states, as mentioned above.

In order to verify the alteration of the configuration data by such a third party, there have been proposed methods that make use of encryption technology (Japanese patent application laid open No. 2003-122442, and Japanese patent application laid-open No. 2003-304235). In these methods, the detection of an alteration of configuration data is made possible by applying an electronic signature to the configuration data by the use of encryption technology.

However, the methods of verifying configuration data using an electronic signature are carried out on a large scale, and will cause an increase in cost, etc.

An object of the present invention is to provide a technique that is capable of inspecting the configuration data of a reconfigurable logical device by the use of a simple method.

SUMMARY OF THE INVENTION

In order to achieve the above object, the present invention resides in a reconfigurable computing device which is characterized by comprising: a reconfigurable logical device of which a circuit logic can be changed based on configuration data (circuit information data); a storage part that stores beforehand input-output attributes of input-output parts of said reconfigurable logical device; and a verification part that verifies said configuration data by making a comparison between information on said input-output parts in said configuration data and the input-output attributes stored in said storage part.

A typical example of "a reconfigurable logical device of which a circuit logic can be changed based on configuration data" is a field programmable gate array (FPGA). However, such a reconfigurable logical device is not limited to an FPGA but can also include any programmable device of which an internal logic circuit can be changed after the manufacture thereof.

Such a reconfigurable logical device not only can change logic cells which perform logical operations, and wiring between the logic cells, but also can change the attributes (whether input or output) of input-output parts which perform input and output with a peripheral circuit. What kind of state the attributes of the input-output parts should be in can be easily created from the peripheral circuit and a device circuit diagram of the reconfigurable logical device. The storage part stores the correct input-output attributes of the input-output parts which have been created beforehand based on the device circuit diagram in this manner.

The verification part can judge whether the configuration data is correct, by making a comparison between setting data (whether input or output) of the input-output parts included in the configuration data and the input-output attributes stored in the storage part. In cases where the input-output attributes of configuration data are different from those which are stored, the circuit logic is not changed.

With such a simple construction, in cases where the configuration data has been in error or altered, such can be detected. Since it is avoidable that both the input-output parts and the peripheral circuit connected thereto will be in output states, it is possible to prevent the failure or damage of the device.

Here, note that the present invention can also be understood as a method for inspecting configuration data in a reconfigurable computing device having a reconfigurable logical device of which a circuit logic can be changed based on the configuration data, characterized by comprising: storing beforehand input-output attributes of input-output parts of said reconfigurable logical device; and verifying said configuration data by making a comparison between information on the input-output parts of said configuration data and said input-output attributes stored.

According to the present invention, it becomes possible to inspect the configuration data of a reconfigurable logical device by means of a simple method.

BRIEF DESCRIPTION OF THE DRAWINGS

FIG. 3 is a view showing the circuit construction of an interface cell.

DESCRIPTION OF THE EMBODIMENTS

Hereinafter, a preferred embodiment of this invention will be described in detail by way of example with reference to the attached drawings.

Figure 1:
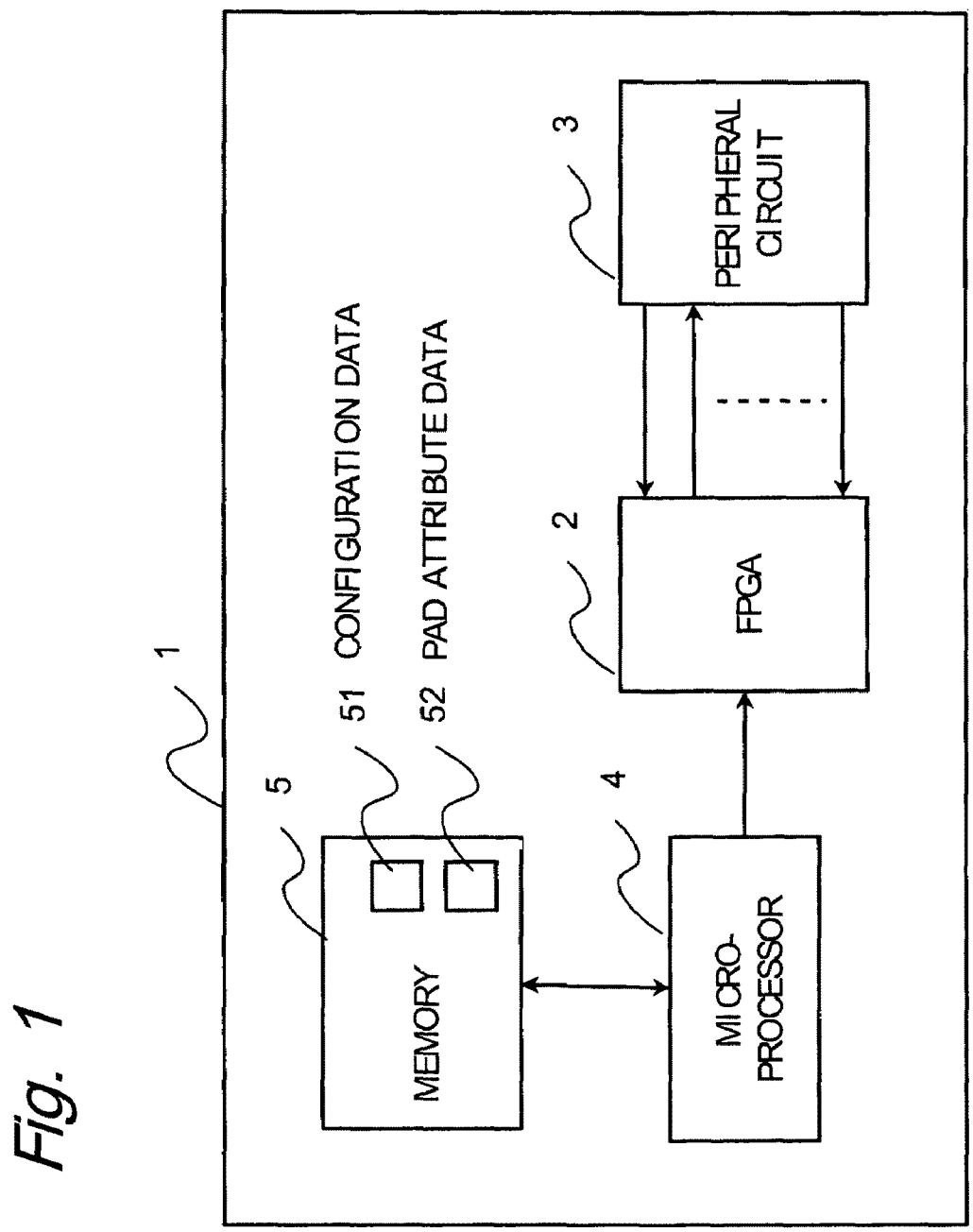
FIG. 1 is a view showing the overall construction of a reconfigurable computing device.

FIG. 1 is a view showing the overall construction of a reconfigurable computing device according to an embodiment of the present invention. As shown in FIG. 1, the reconfigurable computing device 1 according to this embodiment is comprised generally of an FPGA 2, a peripheral circuit 3, a microprocessor 4, and a memory 5.

Configuration data 51 and pad attribute data 52 (all will be described later) of the FPGA 2, as well as programs, etc., are written in the memory 5. The configuration data are written into the memory 5 via a wireless communications network, a recorded storage medium, or the like. The pad attribute data 52 is written at the time of a product manufacture.

The microprocessor 4 performs various processing such as the inspection of the configuration data 51 stored in the memory 5, memory access, downloading of the configuration data 51 into the FPGA 2, etc.

The configuration of the FPGA 2 can be changed based on the configuration data 51 downloaded from the microprocessor 4. In addition, the FPGA 2 performs data access to the peripheral circuit 3 through pads 23, which are input-output parts.

Figure 2:
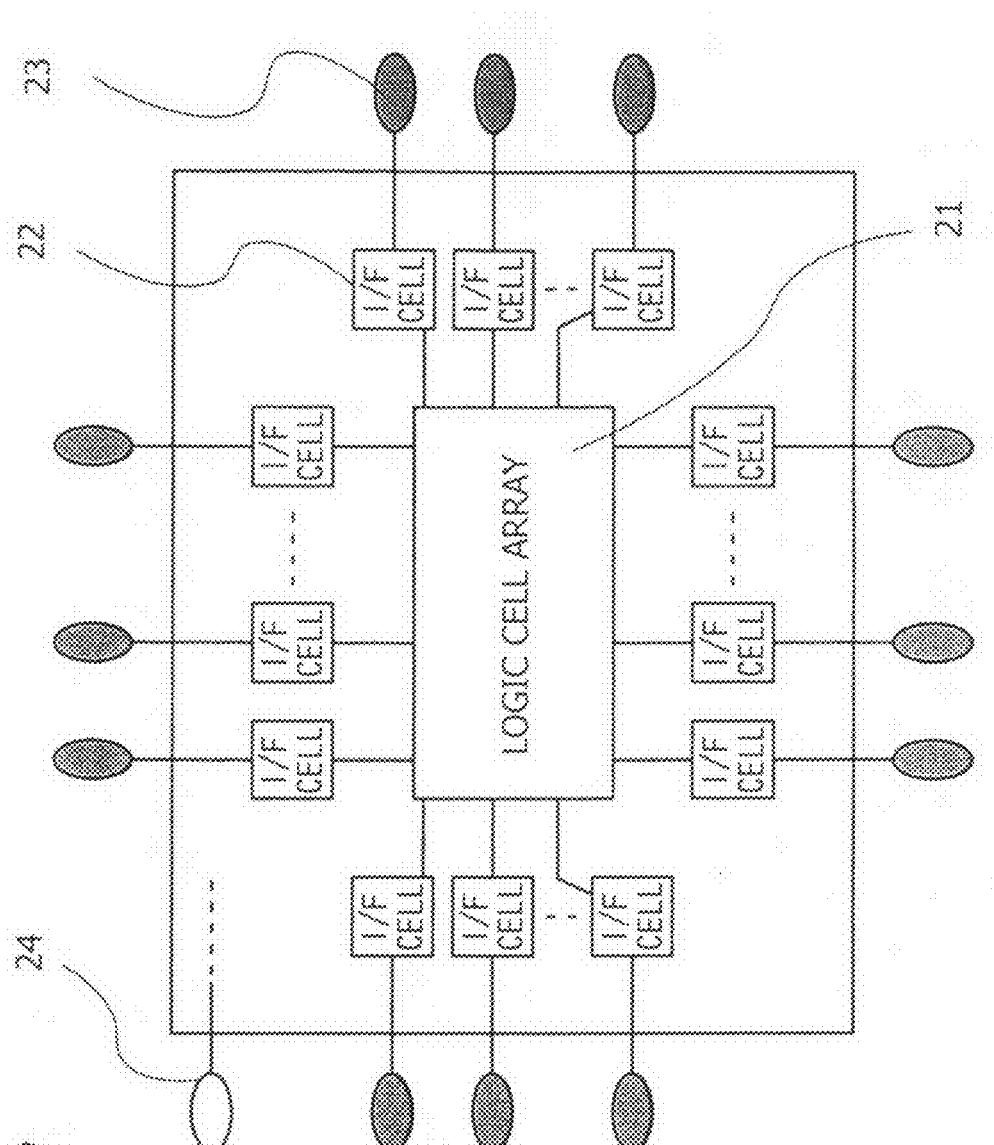
FIG. 2 is a view showing the internal construction of an FPGA.

FIG. 2 is a view showing the internal construction of the FPGA. The FPGA 2 includes a logic cell array 21, interface cells 22, the pads 23, and a configuration data port 24. The logic cell array 21 is composed of a plurality of logical circuit cells which can be programmed. The interface cells 22 are interface circuits for the logic cell array 21 and the pads 23, respectively, and can also be programmed. The setting of each of the interface cells 22 differs depending on whether the attribute of a corresponding pad 23 is an input or an output, and is defined by the configuration data 51. The configuration data 51 is inputted from the configuration data port 24, and is stored in a memory or a flip-flop inside the FPGA 2, so that the function of the entire FPGA 2 is defined.

FIG. 3 is a view showing a circuit construction example of an interface cell 22. The interface cell 22 is comprised of a receiver 221, a driver 222, switches 223a, 223b, a flip-flop (FF) 224, and an inverter 225. FIG. 3 shows a state in which a logic signal is inputted from the outside of the FPGA 2, with the switch 223a between a pad 23 and the receiver 221 being set to be in an on state, and the switch 223b between the driver 222 and the pad 23 being set to be in an off state. The state (input or output) of the interface cell 22 can be set by the value of a bit that is stored in the FF 224. In the case of the illustrated example, when "1" is stored in the FF 224, the interface cell 22 is constructed as an input circuit. Here, in this example, it is assumed that when a control signal for the switches 223 is "1", these switches are turned on.

Figure 4A:
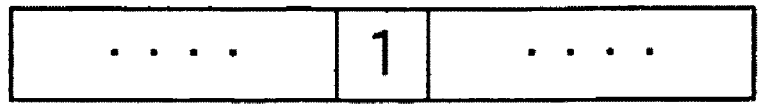
FIG. 4A is a view showing the content of normal configuration data.
Figure 4B:
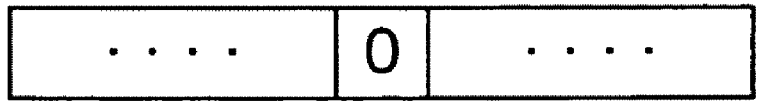
FIG. 4B is a view showing the content of altered configuration data.

FIGS. 4A and 4B are views showing the different contents of the configuration data 51, respectively. A setting of each interface cell 22 and setting data of the logic cell array 21 are contained in the configuration data 51. The bits shown in FIGS. 4A and 4B are bits that determine the function of an interface cell 22 corresponding to a pad 23 to which attention is paid. Here, let us consider the case in which the noted interface cell 22 is intended to be constructed as an input. Accordingly, a bit value of "1" shown in FIG. 4A is a correct value. FIG. 4B is assumed to show the data in which only this bit has been altered.

Figure 4C:
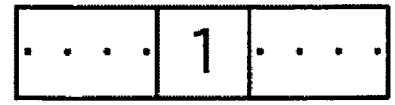
FIG. 4C is a view showing the content of pad attribute data.

In addition, FIG. 4C shows the pad attribute data 52, and a bit shown in this figure is attribute data of the noted pad 23. The attribute data (whether an input or an output) of each pad 23 can be uniquely determined beforehand by means of a designed circuit in the FPGA 2 and the peripheral circuit 3. Accordingly, the pad attribute data 52 has been beforehand created and stored in the memory 5. Here, note that in contrast to the pad attribute data 52 which is composed only of the attributes of the respective pads 23, the configuration data 51 also include the setting data of the respective interface cells 22 and the setting data of the logic cell array 21, and hence has a larger amount of data as compared with the pad attribute data 52.

Figure 5:
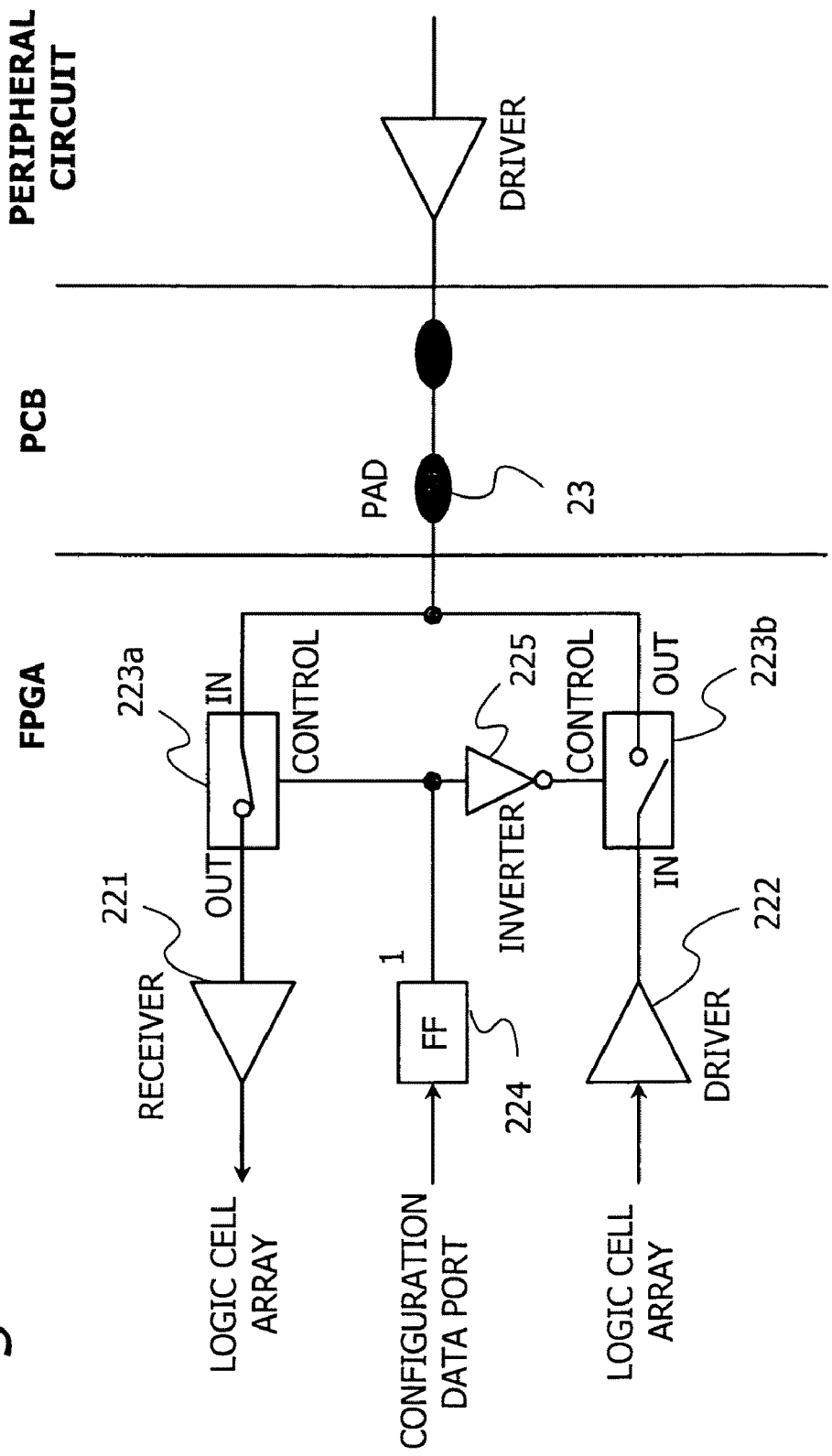
FIG. 5 is a view showing the circuit construction of an FPGA that is achieved by correct configuration data.
Figure 6:
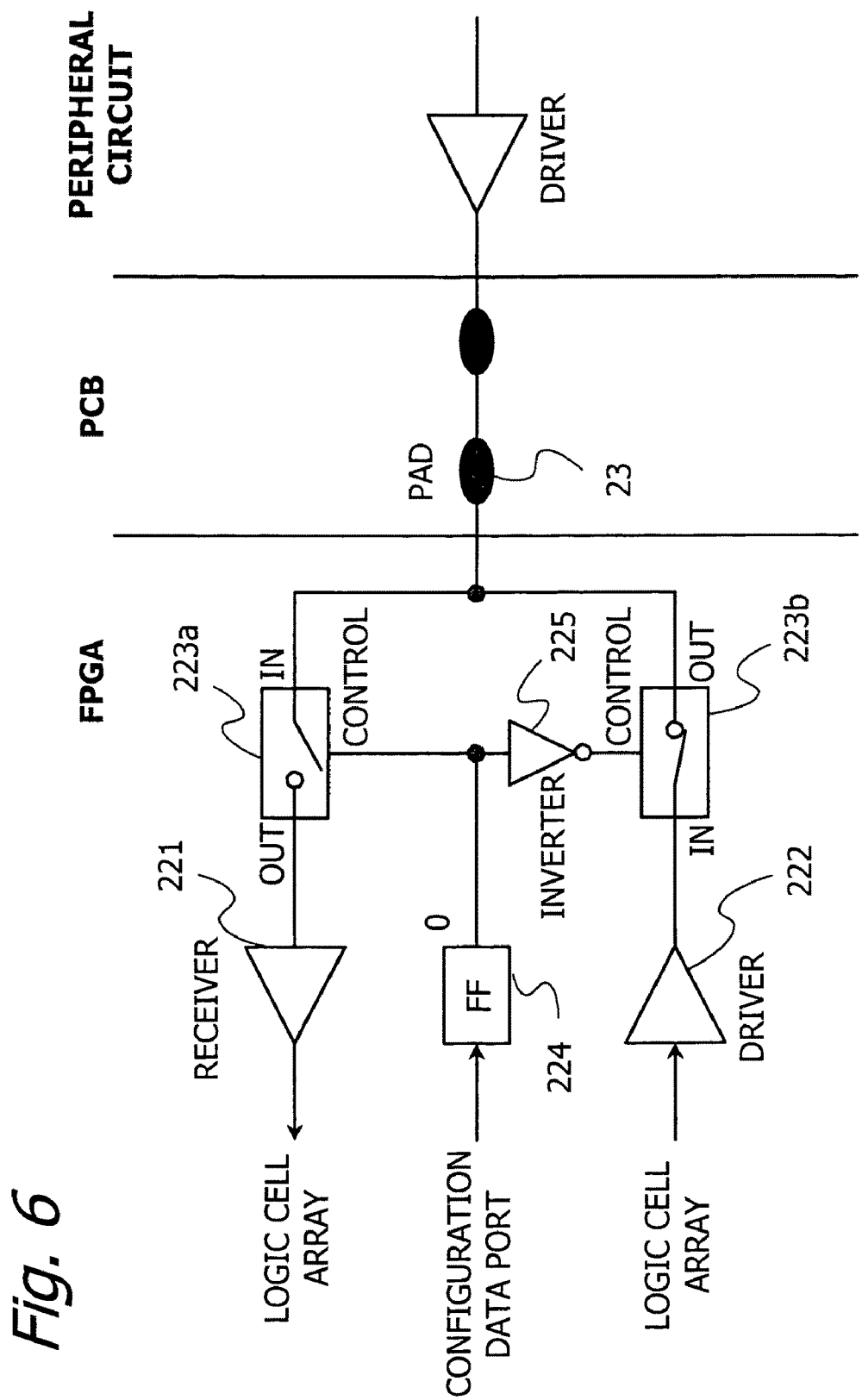
FIG. 6 is a view showing the circuit construction of an FPGA that is achieved by altered (incorrect) configuration data.

FIG. 5 is a circuit construction that is achieved by downloading the correct configuration data 51 shown in FIG. 4A to the FPGA 2. FIG. 6 shows a circuit that is achieved by downloading the altered configuration data 51 shown in FIG. 4B. In the circuit construction shown in FIG. 5, the peripheral circuit 3 is in an output state and the interface cell 22 is in an input state, whereas in the circuit construction shown in FIG. 6, both the peripheral circuit 3 and the interface cell 22 are in output states. Accordingly, in the circuit construction that is based on the altered configuration data 51 of FIG. 6, there will be a high probability of resulting in a circuit failure.

Thus, the microprocessor 4 performs inspection by checking the configuration data 51 with the pad attribute data 52. Then, in cases where the configuration data 51 has been altered, the downloading of the configuration data 51 to the FPGA 2 can be stopped, thereby making it possible to prevent an abnormal circuit construction as shown in FIG. 6 from being achieved.

Figure 7:
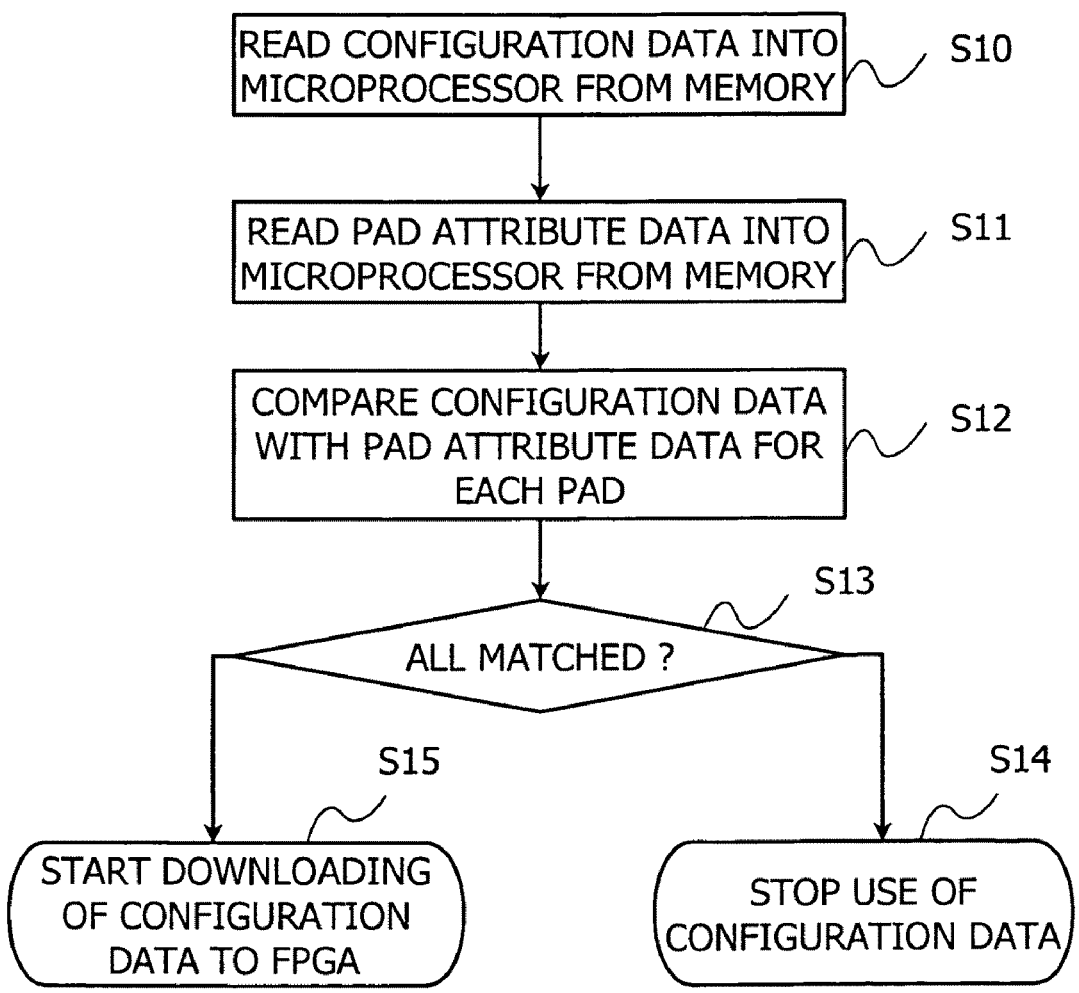
FIG. 7 is a flow chart showing a flow of inspection processing of configuration data.

FIG. 7 is a flow chart showing a flow of inspection processing of the configuration data 51 by means of the microprocessor 4.

The microprocessor 4 first reads in the configuration data 51 from the memory 5 (S10). The microprocessor 4 also reads in the pad attribute data 52 from the memory 5 (S11). Then, the microprocessor 4 makes a comparison between bits of the data set in the pad attribute data 52 and bits at the corresponding addresses of the data set in the configuration data 51 for the respective pads 23 of the FPGA 2 (S12), and judges whether all the corresponding bits are in match with each other (S13). In cases where there is a difference between the configuration data 51 and the pad attribute data 52 for any of the pads (S13—NO), it is found that the configuration data 51 is in error, so the microprocessor 4 stops the use of the configuration data 51 (S14). On the other hand, in cases where there is a match between the configuration data 51 and the pad attribute data 52 for all of the pads (S13—YES), the microprocessor 4 starts the downloading of the configuration data 51 to the FPGA 2 (S15).

In this manner, with the reconfigurable computing device according to this embodiment, it is possible to detect an alteration (error) of the configuration data by a simple method, and hence it is possible to prevent a circuit failure or damage due to an incorrect setting.

INDUSTRIAL APPLICABILITY

According to the present invention, it becomes possible to inspect the configuration data of a reconfigurable logical device by means of a simple method.

What is claimed is:
1. A reconfigurable computing device comprising:
a reconfigurable logical device having logic cells and interface cells, wherein circuit logic of the logic cells and interface cells can be changed based on configuration data including setting data for the logic cells and setting data for the interface cells which indicates whether each of the interface cells will be set as an input or an output;

a storage part that stores beforehand attribute data indicating whether each of the interface cells of the reconfigurable logical device should be set as the input or the output; and a microprocessor that compares the setting data for the interface cells in the configuration data with the attribute data stored in the storage part, and downloads the configuration data to the reconfigurable logical device only if the setting data for the interface cells is in match with the attribute data.

2. A method for inspecting configuration data in a reconfigurable computing device having a reconfigurable logical device with logic cells and interface cells, wherein circuit logic of the logic cells and interface cells can be changed based on the configuration data, the method comprising the steps of:

storing attribute data indicating whether each of the interface cells of the reconfigurable logical device should be set as an input or an output;

obtaining the configuration data including setting data for the logic cells and setting data for the interface cells which indicates whether each of the interface cells will be set as the input or the output;

comparing the setting data for the interface cells in the configuration data with the attribute data; and downloading the configuration data to the reconfigurable logical device only if the setting data for the interface cells is in match with the attribute data.

3. The reconfigurable computing device according to claim 1, wherein the attribute data comprises a bit indicating whether each of the interface cells should be set as the input or as the output, and the microprocessor compares the bit in the attribute data and the setting data for the corresponding interface cell.

4. The method for inspecting configuration data according to claim 2, wherein the attribute data comprises a bit indicating whether each of the interface cells should be set as the input or as the output, and in the step of comparing the bit in the attribute data is compared with the setting data for the corresponding interface cell.

* * * * *

UNITED STATES PATENT AND TRADEMARK OFFICE
CERTIFICATE OF CORRECTION

| | |
|---|---|
| PATENT NO. | : 8,073,988 B2 |
| APPLICATION NO. | : 12/585542 |
| DATED | : December 6, 2011 |
| INVENTOR(S) | : Makoto Honda |

It is certified that error appears in the above-identified patent and that said Letters Patent is hereby corrected as shown below:

Title page, Item (73) Assignee:

Please delete the following:

"(73) Toyota Infotechnology Center., Ltd., Tokyo (JP); TOYOTA JIDOSHA KABUSHIKI KAISHA, Toyota (JP)"

And Replace with

--(73) Toyota Infotechnology Center Co., Ltd., Tokyo (JP); TOYOTA JIDOSHA KABUSHIKI KAISHA, Toyota (JP)--

Signed and Sealed this
Tenth Day of July, 2012

David J. Kappos
*Director of the United States Patent and Trademark Office*